United States Patent
Ta et al.

(10) Patent No.: US 11,916,528 B2
(45) Date of Patent: Feb. 27, 2024

(54) BAND PASS FILTER

(71) Applicant: Skyworks Solutions, Inc., Irvine, CA (US)

(72) Inventors: Hai H. Ta, San Diego, CA (US); Weimin Sun, Santa Rosa Valley, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/660,715

(22) Filed: Apr. 26, 2022

(65) Prior Publication Data

US 2022/0255524 A1    Aug. 11, 2022

Related U.S. Application Data

(63) Continuation of application No. 16/984,666, filed on Aug. 4, 2020, now Pat. No. 11,342,898, which is a
(Continued)

(51) Int. Cl.
*H03H 7/01* (2006.01)
*H03F 3/21* (2006.01)
(Continued)

(52) U.S. Cl.
CPC ........... *H03H 7/0115* (2013.01); *H01L 25/16* (2013.01); *H03F 1/56* (2013.01); *H03F 3/19* (2013.01); *H03F 3/195* (2013.01); *H03F 3/21* (2013.01); *H03F 3/245* (2013.01); *H03F 3/68* (2013.01); *H03H 7/1708* (2013.01); *H03H 7/1758* (2013.01); *H03H 7/1766* (2013.01);

*H03H 7/1775* (2013.01); *H01L 28/10* (2013.01); *H01L 28/40* (2013.01); *H03F 2200/165* (2013.01);
(Continued)

(58) Field of Classification Search
CPC .. H03H 7/0138; H03H 7/0115; H03H 7/1758; H03H 7/01; H03H 2001/0085
USPC .................................................. 333/175, 185
See application file for complete search history.

(56) References Cited

U.S. PATENT DOCUMENTS 6,111,482 A    8/2000 Atokawa
9,660,606 B2    5/2017 Lyalin
(Continued)

OTHER PUBLICATIONS

Wang et al., "A High-Frequency-Compatible Miniaturized Bandpass Filter with Air-Bridge Structures Using GaAs-Based Integrated Passive Device Technology," Micromachines 2018, 10 pages, published Sep. 13, 2018.

*Primary Examiner* — Rakesh B Patel
(74) *Attorney, Agent, or Firm* — Knobbe, Martens, Olson & Bear, LLP

(57) ABSTRACT

Aspects of this disclosure relate to a band pass filter that includes LC resonant circuits coupled to each other by a capacitor. A bridge capacitor can be in parallel with series capacitors, in which the series capacitors include the capacitor coupled between the LC resonant circuits. The bridge capacitor can create a transmission zero at a frequency below the passband of the band pass filter. The LC resonant circuits can each include a surface mount capacitor and a conductive trace of the substrate, and an integrated passive device die can include the capacitor. Band pass filters disclosed herein can be relatively compact, provide relatively good out-of-band rejection, and relatively low loss.

20 Claims, 7 Drawing Sheets

Related U.S. Application Data continuation of application No. 16/201,246, filed on Nov. 27, 2018, now Pat. No. 10,778,174.

(60) Provisional application No. 62/592,943, filed on Nov. 30, 2017.

(51) Int. Cl.

| | | |
|---|---|---|
| *H03F 3/19* | (2006.01) | |
| *H03F 3/68* | (2006.01) | |
| *H01L 25/16* | (2023.01) | |
| *H03F 3/195* | (2006.01) | |
| *H03F 1/56* | (2006.01) | |
| *H03F 3/24* | (2006.01) | |
| *H04B 1/44* | (2006.01) | |
| *H01L 49/02* | (2006.01) | |

(52) U.S. Cl.
CPC .. *H03F 2200/171* (2013.01); *H03F 2200/231* (2013.01); *H03F 2200/294* (2013.01); *H03F 2200/312* (2013.01); *H03F 2200/414* (2013.01); *H03F 2200/451* (2013.01); *H04B 1/44* (2013.01)

(56) References Cited

U.S. PATENT DOCUMENTS

| | | | |
|---|---|---|---|
| 9,978,732 | B2 | 5/2018 | Penunuri et al. |
| 10,778,174 | B2 | 9/2020 | Ta et al. |
| 11,342,898 | B2 | 5/2022 | Ta et al. |
| 2003/0141944 | A1* | 7/2003 | Daniels ................ H03H 7/1775 333/181 |
| 2007/0120627 | A1 | 5/2007 | Kundu |
| 2010/0026420 | A1 | 2/2010 | Chin et al. |
| 2014/0145898 | A1 | 5/2014 | Tokuda |
| 2014/0320252 | A1 | 10/2014 | Sun et al. |
| 2015/0318889 | A1 | 11/2015 | Lee et al. |
| 2016/0093578 | A1* | 3/2016 | Penunuri ................. H01L 25/16 257/532 |
| 2016/0294351 | A1 | 10/2016 | Huang et al. |
| 2017/0310296 | A1 | 10/2017 | Hahn et al. |
| 2019/0181827 | A1* | 6/2019 | Timme .................... H04B 1/10 |
| 2021/0058051 | A1 | 2/2021 | Ta et al. |

\* cited by examiner

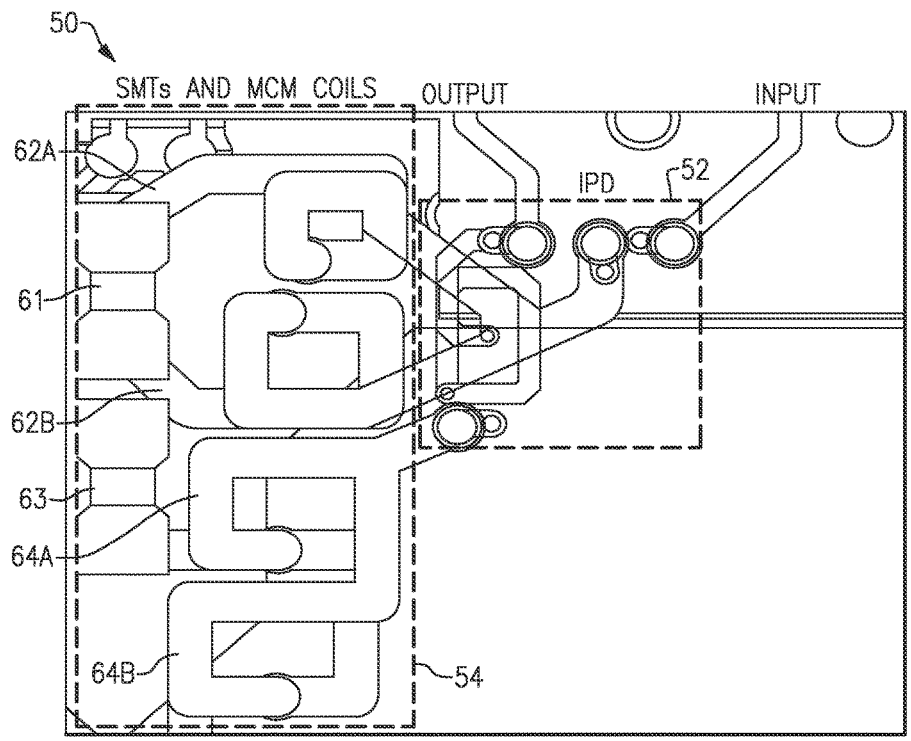
FIG.5
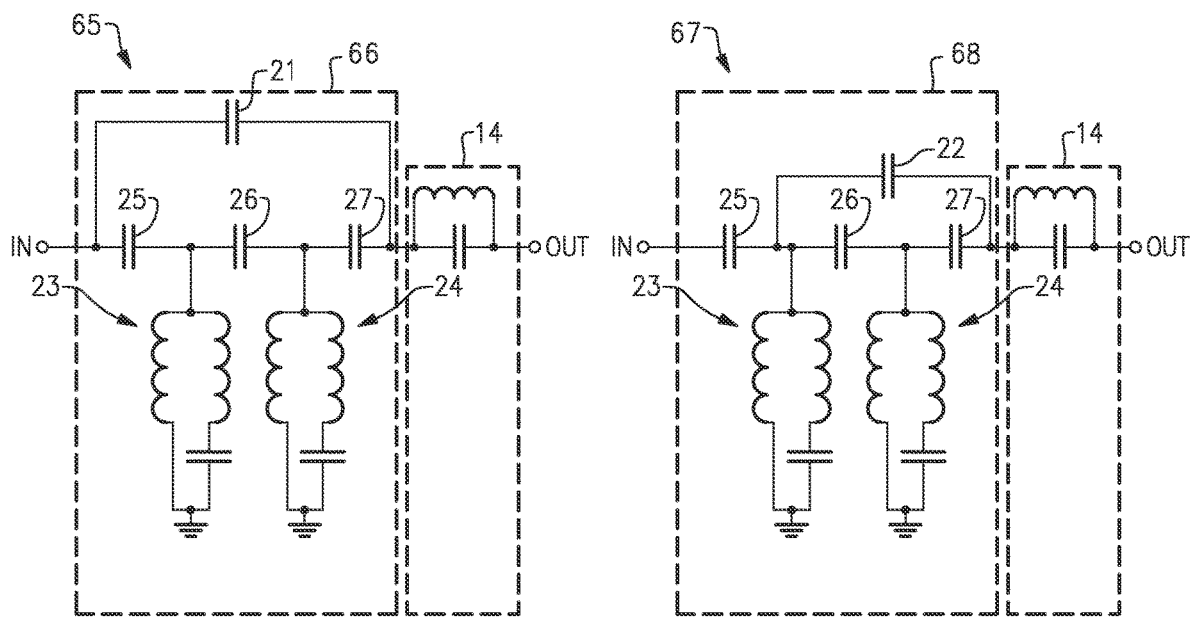
FIG.6A
FIG.6B

BAND PASS FILTER

CROSS REFERENCE TO PRIORITY APPLICATIONS

Any and all applications for which a foreign or domestic priority claim is identified in the Application Data Sheet as filed with the present application are hereby incorporated by reference under 37 CFR § 1.57. This application is a continuation of U.S. patent application Ser. No. 16/984,666, filed Aug. 4, 2020 and titled "BAND PASS FILTER," which is a continuation of U.S. patent application Ser. No. 16/201,246, filed Nov. 27, 2018 and titled "BAND PASS FILTER," which claims the benefit of priority under 35 U.S.C. § 119(e) of U.S. Provisional Patent Application No. 62/592,943, filed Nov. 30, 2017 and titled "FILTER FOR WIRELESS COMMUNICATION SYSTEM," the disclosures of each of which are hereby incorporated by reference in their entireties herein.

BACKGROUND

Technical Field

Embodiments of this disclosure relate to filters, such as band pass filters for wireless communication systems.

Description of Related Technology

A band pass filter passes frequencies within a passband and attenuates frequencies above and below the passband. A variety of circuit topologies can implement a band pass filter. Band pass filters have been implemented by acoustic wave devices, low temperature co-fired ceramics, or integrated passive devices. A band pass filter with good attenuation outside of the passband and relatively low insertion loss in the passband is generally desirable.

Band pass filters can be implemented in radio frequency electronic systems. For instance, filters in a radio frequency front end of a mobile phone can include band pass filters. Meeting performance specifications for certain band pass filters in radio frequency electronic systems can be challenging.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a band pass filter that includes a first LC resonant circuit, a second LC resonant circuit, capacitors arranged in series with each other, and a bridge capacitor. A capacitor of the capacitors is coupled between the first LC resonant circuit and the second LC resonant circuit. The band pass filter has a pass band. The bridge capacitor is arranged to create a transmission zero at a frequency below the passband of the band pass filter.

The capacitors and the bridge capacitor can be implemented on an integrated passive device die. The first LC resonant circuit can include a surface mount capacitor and a conductive trace of a substrate.

The band pass filter can include a second bridge capacitor in parallel with a subset of the capacitors, in which the capacitors include at least three capacitors in series with each other. The second bridge capacitor can be arranged to create a second transmission zero at a second frequency below the passband of the band pass filter.

The band pass filter can include an LC tank in series between the capacitors and an output of the band pass filter. The LC tank can be arranged to create an upper transmission zero above the passband.

The first LC resonant circuit can include a shunt inductor in parallel with a series LC shunt circuit. The series LC shunt circuit can be arranged to create an upper transmission zero at a frequency above the passband of the band pass filter.

The first LC resonant circuit can include a first series LC shunt circuit arranged to create a first upper transmission zero at a frequency above the passband, and the second LC resonant circuit can include a second series LC shunt circuit arranged to create a second upper transmission zero at a second frequency above the passband.

A lower bound of the passband can be above 3 gigahertz. The passband can be from 3.4 gigahertz to 3.8 gigahertz. The passband can be from 3.4 gigahertz to 3.6 gigahertz.

Another aspect of this disclosure is a filter assembly that includes a first LC resonant circuit, a second LC resonant circuit, and an integrated passive device die on a substrate. The first LC resonant circuit includes a first conductive trace of the substrate and a first surface mount capacitor on the substrate. The second LC resonant circuit includes a second conductive trace of the substrate and a second surface mount capacitor on the substrate. The integrated passive device die includes a capacitor coupled between the first LC resonant circuit and the second LC resonant circuit. The capacitor, the first LC resonant circuit, and the second LC resonant circuit are included in a band pass filter.

The integrated passive device die can include a second capacitor in series with the capacitor, and a bridge capacitor in parallel with the series combination of the capacitor and the second capacitor. The integrated passive device die can include a third capacitor in series with the capacitor and the second capacitor, and a second bridge capacitor in parallel with the series combination of the capacitor, the second capacitor, and the third capacitor.

The first surface mount capacitor can be coupled between the first conductive trace and ground. The first LC resonant circuit can include a series LC shunt circuit in parallel with the first conductive trace, in which the series LC shunt circuit includes the first surface mount capacitor. The first surface amount capacitor can be a shunt capacitor, and the first conductive trace can be in parallel with the first surface mount capacitor. The second surface mount capacitor and the second conductive trace can be arranged as a parallel LC shunt circuit. The filter assembly can include an LC tank circuit coupled between the capacitor and an output of the band pass filter.

A passband of the band pass filter can have a lower bound above 3 gigahertz. A passband of the band pass filter can be from 3.4 gigahertz to 3.8 gigahertz. A passband of the band pass filter can be from 3.4 gigahertz to 3.6 gigahertz.

Another aspect of this disclosure is front end module that includes a band pass filter, a power amplifier, a low noise amplifier, and a transmit/receive switch. The band pass filter includes a first LC resonant circuit, a second LC resonant circuit, capacitors arranged in series with each other and including a capacitor coupled between the first LC resonant circuit and the second LC resonant circuit, and a bridge capacitor coupled in parallel with the capacitors. The bridge capacitor arranged to create a transmission zero at a frequency below a passband of the band pass filter. The transmit/receive switch is configured to selectively couple the band pass filter to the power amplifier or the low noise amplifier.

The band pass filter of the front end module can include any suitable features of the band pass filters disclosed herein. The band pass filter of the front end module can include any suitable features of the filter assemblies disclosed herein.

Another aspect of this disclosure is a diversity receive module that includes a diversity receive port and a band pass filter. The diversity receive port is arranged to receive a signal from a diversity antenna. The band pass filter has an input coupled to the diversity receive port. The band pass filter includes a first LC resonant circuit, a second LC resonant circuit, capacitors arranged in series with each other and including a capacitor coupled between the first LC resonant circuit and the second LC resonant circuit, and a bridge capacitor coupled in parallel with the capacitors. The bridge capacitor is arranged to create a transmission zero at a frequency below a passband of the band pass filter.

The band pass filter of the diversity receive module can include any suitable features of the band pass filters disclosed herein. The band pass filter of the diversity receive module can include any suitable features of the filter assemblies disclosed herein.

A wireless communication device can include one or more suitable features of any of the band pass filters, filter assemblies, front end modules, or diversity receive modules disclosed herein.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 5 is a diagram of a layout of a band pass filter of FIG. 3 according to an embodiment.

FIG. 6A a schematic diagram of a filter topology according to an embodiment.

FIG. 6B a schematic diagram of a filter topology according to an embodiment.

DETAILED DESCRIPTION OF CERTAIN EMBODIMENTS

Figure 1:
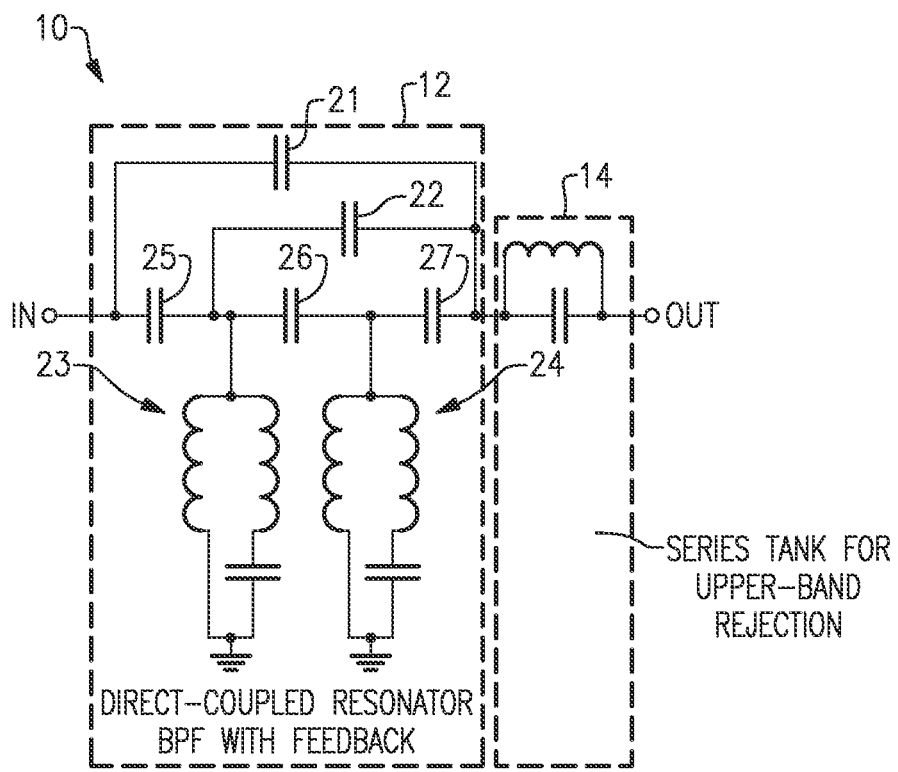
FIG. 1 is a schematic diagram of a filter topology according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A band pass filter (BPF) is a significant component in communication systems. There is a need to design BPFs that have a relatively low loss, good out-of-band rejection, compact size, and relatively low cost. Such BPFs can be integrated in a radio frequency (RF) front end module for a mobile device.

Current band pass filters for filtering Ultra High Band (UHB) frequencies integrated in RF front end modules can include acoustic wave filters such as surface acoustic wave (SAW) filters and/or bulk acoustic wave (BAW) filters, Low Temperature Co-Fired Ceramic (LTCC) filters, or integrated passive device (IPD) filters.

This disclosure provides BPFs with relatively low loss, good out-of-band rejection, compact size, and relatively low cost. Such BPFs can include frequency traps into coupled resonators to create transmission zeros at upper frequency bands. Feedback networks of the BPFs can provide transmission zeros at lower frequency bands. Relatively high quality factor (Q) surface mount technology (SMT) capacitors can be used for certain capacitors of the BPFs to provide desirable in-band insertion loss. Relatively small shunt inductors can be implemented on a laminate to provide a desirable Q, which can help reduce loss of the BPF. Relatively less loss sensitive capacitors and high frequency traps can be implemented on an IPD die for a compact size.

The BPFs discussed herein can realize one or more of the following advantages, among others, over state of the art BPFs. BPFs discussed herein can be relatively inexpensive to implement. For example, BPFs discussed herein are more cost effective than corresponding acoustic wave filters or LTCC filters. This can be due to the BPFs being implemented partly on laminate and a compact IPD die. Both laminate and an IPD die are less expensive to fabricate than acoustic wave filters and LTCC filters. BPFs discussed herein can be compact. For instance, BPFs discussed herein can be significantly smaller than LTCC filters and comparable in size to acoustic wave filters. BPFs discussed herein can be relatively low loss. For example, BPFs discussed herein can have lower in-band insertion loss compared to acoustic wave filters and comparable in-band insertion loss compared to LTCC filters.

FIG. 1 is a schematic diagram of a filter topology according to an embodiment. As illustrated in FIG. 1, a filter 10 includes a direct-coupled resonator filter with feedback 12 and a series LC tank 14. The filter 10 can be a band pass filter arranged to pass radio frequency signals having a frequency above 3 GHz, such as Band 42 signals and/or Band 43 signals. The filter 10 can be used in 5th generation wireless systems (5G) applications.

The direct-coupled resonator filter with feedback 12 includes a first bridge capacitor 21, a second bridge capacitor 22, a first LC resonant circuit 23, a second LC resonant circuit 24, and coupling capacitors 25, 26, and 27. The first bridge capacitor 21 has a first end coupled to the series LC tank 14 and a second end coupled to an input node of the filter 10. The first bridge capacitor 21 is in parallel with the coupling capacitors 25, 26, and 27.

The first LC resonant circuit 23 is an LC shunt resonant circuit. As illustrated, the first LC resonant circuit 23 includes a shunt inductor in parallel with a series LC circuit. The second bridge capacitor 22 has a first end coupled to the series LC tank 14 and a second end coupled the first LC resonant circuit 23. The second bridge capacitor 22 is in parallel with the coupling capacitors 26 and 27. The second LC resonant circuit 24 is an LC shunt resonant circuit. As illustrated, the second LC resonant circuit 24 includes a shunt inductor in parallel with a series LC circuit.

A first coupling capacitor 25 is coupled between an input of the filter 10 and a node at which the first coupling capacitor 25 is coupled to the first LC resonant circuit 23 and the second coupling capacitor 26. A second coupling capacitor 26 is coupled in series between the first coupling capacitor 25 and the second coupling capacitor 27. The second coupling capacitor 26 is also coupled between the first LC resonant circuit 23 and the second LC resonant circuit 24. A third coupling capacitor 27 is coupled between series LC tank 14 and a node at which the third coupling capacitor 27 is coupled to the second LC resonant circuit 24 and the second coupling capacitor 26.

The series LC tank 14 is an LC tank arranged in series between the direct-coupled resonator filter with feedback 12 and an output of the filter 10. The illustrated series LC tank 14 is a parallel LC circuit.

Figure 2:
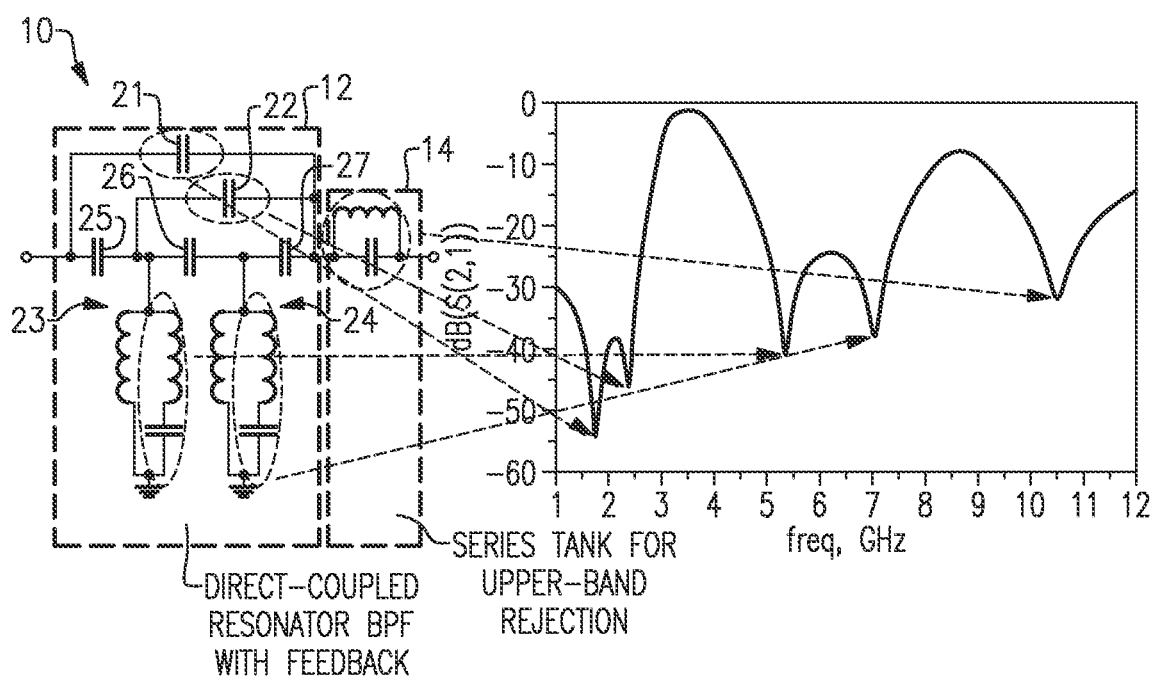
FIG. 2 includes the schematic diagram of FIG. 1 with a graph of a frequency response corresponding to the filter of FIG. 1 according to an embodiment.

FIG. 2 includes the schematic diagram of FIG. 1 with a graph of a frequency response corresponding to the filter 10 of FIG. 1 according to an embodiment. The frequency response of FIG. 2 corresponds to a band pass filter with passband from 3.4 GHz to 3.8 GHz. A filter with such a frequency response can filter Band 42 and Band 43 signals.

FIG. 2 also indicates how circuit elements of the filter 10 can contribute to the frequency response of the filter 10. As shown in FIG. 2, lower-band transmission zeros can be controlled by feedback networks created by the bridge capacitors 21 and 22. Each of the bridge capacitors 21 and 22 can create a separate transmission zero at a respective frequency below the passband of the filter 10. In the frequency response shown in FIG. 2, these transmission zeros are at around 1.8 GHz and 2.4 GHz. The bridge capacitors can have respective capacitances so as to create transmission zeros at particular frequencies. These transmission zeros can correspond to frequencies where other signals, such as signals associated with different carriers than the input signal to the filter 10 in a carrier aggregation system, in the system are located. Accordingly, the filter 10 can provide strong rejection to reduce and/or eliminate noise from the other signals. The bridge capacitors 21 and 22 can have capacitances of a couple of picofarads (pF) or less in certain applications.

A method of filtering a radio frequency signal with a band pass filter, such as the filter 10 with the frequency response shown in FIG. 2, is provided. The method includes receiving the radio frequency signal at an input port of the band pass filter. The band pass filter has a passband. The band pass filter includes a first LC resonant circuit, a second LC resonant circuit, capacitors arranged in series with each other in which a capacitor of the capacitors is coupled between the first LC resonant circuit and the second LC resonant circuit, and a bridge capacitor coupled in parallel with the capacitors. The method includes filtering the radio frequency signal with the band pass filter such that a transmission zero is created at a frequency below the passband of the band pass filter.

The filtering can include creating, with a second bridge capacitor in parallel with a subset of the capacitors, a second transmission zero at a second frequency below the passband of the band pass filter. Alternatively or additionally, the filtering can include creating, with an LC tank in series between the capacitors and an output of the band pass filter, an upper transmission zero at a frequency above the passband.

In certain instances, the filtering can include creating, with a series LC shunt circuit of the first LC resonant circuit, an upper transmission zero at a frequency above the passband of the band pass filter. In some of such instances, the filtering can include creating, with a second series LC shunt circuit of the second LC resonant circuit, a second upper transmission zero at a second frequency above the passband.

The method can include filtering a radio frequency signal having a frequency of more than 3 gigahertz, such as a signal having a frequency in a range from 3.4 gigahertz to 3.8 gigahertz.

The method can include using a band pass filter with any suitable combination of features of the band pass filter 10 of FIG. 1. The filtering of the method can involve filtering a radio frequency signal so as to create any suitable features of the frequency response shown in FIG. 2.

FIG. 2 also illustrates that upper-band transmission zeros can be created by shunt LC circuits of the LC resonant circuits 23 and 24, respectively. The capacitance and inductance of each of the LC shunt circuits can be arranged to provide a transmission zero at a desired frequency. These transmission zeros can be at harmonics of other signals of the system. An extra upper-band transmission zero can be created by the series LC tank 14. The inductance and capacitance of the series LC tank 14 can be selected to create this extra upper-band transmission zero at a desired frequency. For instance, an extra upper transmission zero can be at a second harmonic of a 5 GHz Wi-Fi signal.

Figure 3:
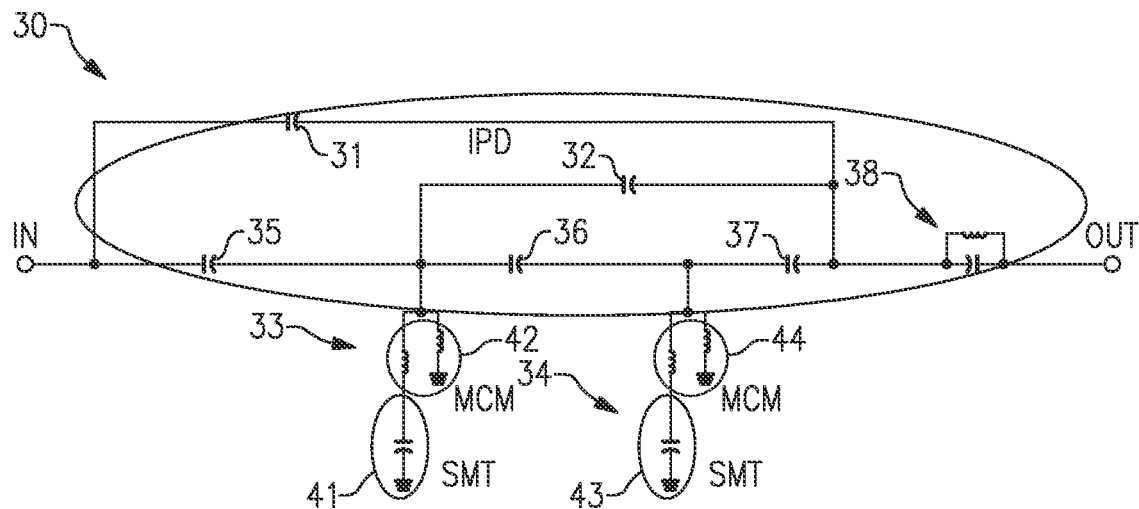
FIG. 3 is a schematic diagram of a band pass filter according to an embodiment.

FIG. 3 is a schematic diagram of a band pass filter 30 according to an embodiment. The band pass filter 30 can be a Band 42/Band 43 band pass filter with harmonic rejections for a power amplifier front end module. The band pass filter 30 is a hybrid design that includes circuit elements of different technologies. The band pass filter 30 includes integrated passive devices (IPDs) on an IPD die, conductive traces of a laminate, and surface mount capacitors. A filter assembly can include the illustrated circuit elements of the band pass filter 30.

The band pass filter 30 has the same circuit topology as the filter 10 of FIG. 1. In the band pass filter 30, certain circuit elements are implemented by various technologies. As shown in FIG. 3, a first bridge capacitor 31, a second bridge capacitor 32, coupling capacitors 35, 36, and 37, and a series LC tank 38 are implemented by IPDs. These integrated passive devices can be implemented on a single IPD die.

Inductors 42 of a first LC resonant circuit 33 can be implemented by conductive traces of a laminate substrate (e.g., the conductive traces can be on and/or in the laminate substrate). Capacitor 41 of the first LC resonant circuit 33 can be a surface mount capacitor.

Inductors 44 of a second LC resonant circuit 34 can be implemented by conductive traces of the laminate substrate (e.g., the conductive traces can be on and/or in the laminate substrate). Capacitor 43 of the second LC resonant circuit 34 can be a surface mount capacitor. The band pass filter 30 can be shared for both transmit and receive paths in a radio frequency front end. With The band pass filter 30, an external acoustic filter for the receive path can be omitted.

Figure 4:
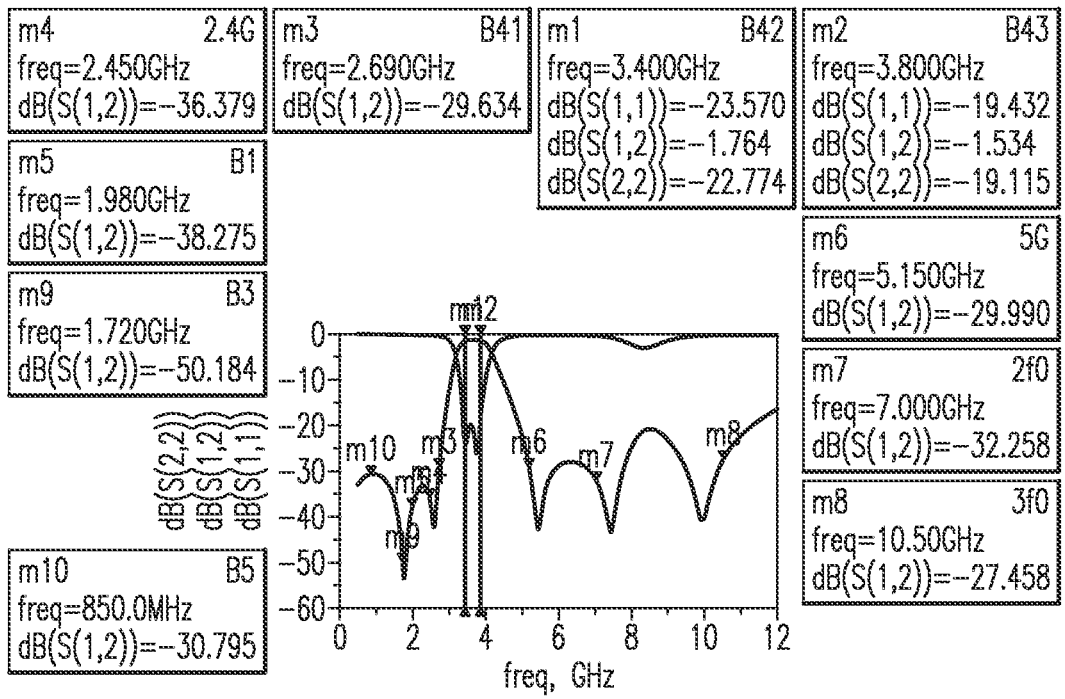
FIG. 4 is a graph of a frequency response corresponding to the band pass filter of FIG. 3 according to an embodiment.

FIG. 4 is a graph of simulation results a frequency response corresponding to the band pass filter 30 of FIG. 3 according to an embodiment. This simulation is for a Band 42/Band 43 band pass filter design with harmonic rejection. For this simulation, the IPD capacitors have a Q of 70 at 3.5 GHz, the SMT capacitors have a Q of 120 at 3.5 GHz, and the conductive traces have a Q of about 50 at 3.5 GHz. These example Q values are in a typical range of Q values for the various technologies, although other Q values can be implemented. As shown in FIG. 4, the band pass filter 30 can cover both Band 42 and Band 43 with in-band insertion loss better than 1.8 dB. As also shown by FIG. 4, the band pass filter can provide good out-of-band rejections for Band 1, Band 3, Band 5, Band 41 and low/high-band Wi-Fi. The band pass filter 30 can also provide harmonic rejections, which are typically desired for a power amplifier front end module.

FIG. 5 is a diagram of a filter assembly 50 according to an embodiment. The filter assembly 50 illustrates an example layout for the band pass filter 30 of FIG. 3. The filter assembly 50 can include a band pass filter for Band 42 and/or Band 43. Such a band pass filter can have a passband from 3.4 GHz to 3.8 GHz, for example. The filter assembly 50 includes an IPD die 52 and a surface mount device and laminate coil section 54.

The IPD die 52 can include the IPDs of the band pass filter 30 of FIG. 3. For instance, the IPDs can include bridge capacitors 31 and 32, coupling capacitors 35, 36, and 37, and a capacitor and an inductor of an LC tank 38.

The surface mount device and laminate coil section 54 includes a first surface mount capacitor 61 and a second surface mount capacitor 63. These surface mount capacitors are shunt capacitors of LC resonant circuits as illustrated. The surface mount capacitors 61 and 63 correspond to the surface mount capacitors 41 and 42, respectively, of FIG. 3. The surface mount device and laminate coil section 54 also includes conductive traces 62A, 62B, 64A, and 64B on and/or in a laminate substrate. These conductive traces can be printed coils on a laminate substrate or any other suitable packaging substrate. The conductive traces 62A and 62B can correspond to the inductors 42 of FIG. 3. The conductive traces 64A and 64B can correspond to the inductors 44 of FIG. 3.

A method of manufacturing a filter assembly, such as the filter assembly 50 of FIG. 5, is provided. The method includes providing a substrate with conductive traces on and/or in a substrate. The method includes mounting surface mount capacitors on the substrate such that the conductive traces and the surface mount capacitors form at least a first resonant LC circuit and a second resonant LC circuit. The method includes attaching an integrated passive device die on a substrate. After the mounting and the attaching, a band pass filter includes the first LC resonant circuit, the second LC resonant circuit, and a capacitor of the integrated passive device die. The capacitor is coupled between the first LC resonant circuit and the second LC resonant circuit.

The band pass filter can include additional capacitors of the integrated passive device die. For instance, the band pass filter can include a second capacitor of the integrated passive device die in series with the capacitor, and a bridge capacitor of the integrated passive device die in parallel with the series combination of the capacitor and the second capacitor. In some such instances, the band pass filter can include a third capacitor of the integrated passive device die in series with the capacitor and the second capacitor, and a second bridge capacitor of the integrated passive device die in parallel with the series combination of the capacitor, the second capacitor, and the third capacitor. The band pass filter can include an LC tank of the integrated passive device die coupled between the capacitor and an output of the band pass filter.

The attaching the integrated passive devices die can include flip chip mounting the integrated passive devices die on the substrate and connecting the integrated passive devices die to bump pads on the substrate with bumps. Alternatively or additionally, the integrated passive devices die can be electrically connected to one or more pads of the substrate by one or more respective wire bonds.

The mounting the surface mount capacitors can electrically connect a first end of a first surface mount capacitor to ground and electrically connect a second end of the first surface mount capacitor to a first conductive trace of the conductive traces.

The method can include manufacturing a filter assembly that includes a band pass filter with any suitable combination of features of any of the band pass filters disclosed herein. For example, the band pass filter can include any suitable combination of features of the band pass filter 30 of FIG. 3 and/or the band pass filter 80 of FIG. 8.

The principles and advantages of the filters discussed herein can be implemented in different filter topologies. For example, a different number of bridge capacitors can be implemented in different filters. FIGS. 6A and 6B illustrate filter topologies that include a single bridge capacitor. The filter 65 of FIG. 6A is like the filter 10 of FIG. 1, except that the filter 65 omits the second bridge capacitor 22 of the filter 10. The filter 65 includes a direct-coupled resonator filter with feedback 66 with only one bridge capacitor 21. The filter 67 of FIG. 6B is like the filter 10 of FIG. 1, except that the filter 67 omits the first bridge capacitor 21 of the filter 10. The filter 67 includes a direct-coupled resonator filter with feedback 68 with only one bridge capacitor 22. In some instances, three or more bridge capacitors can be included in filter, such as a filter with more resonator tanks than shown in FIG. 1, FIG. 6A, or FIG. 6B.

Figure 7:
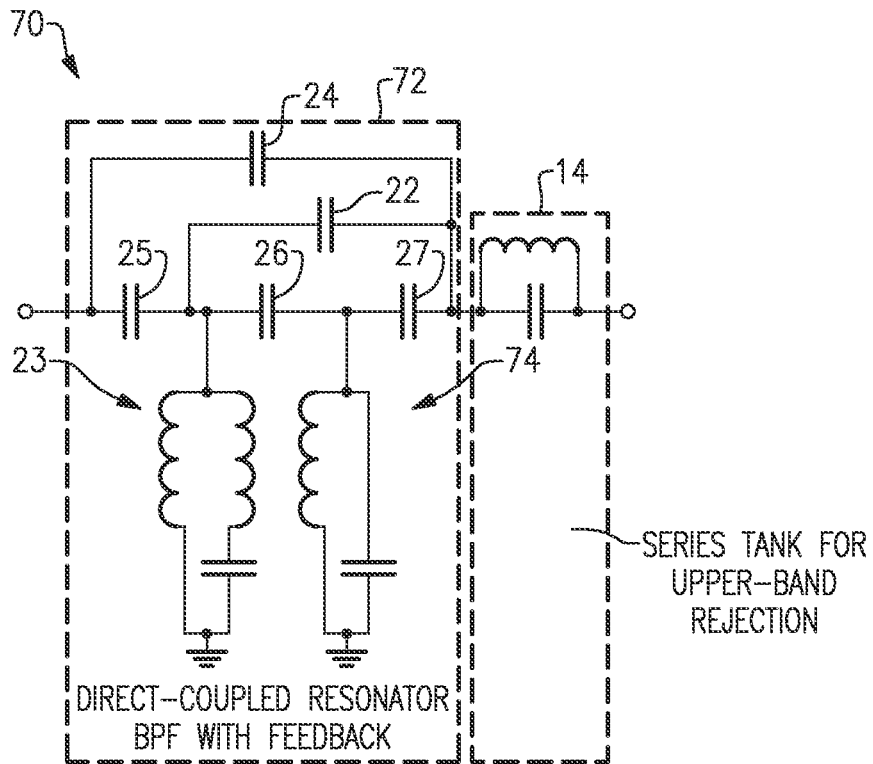
FIG. 7 is a schematic diagram of a filter topology according to an embodiment.

FIG. 7 is a schematic diagram of a filter topology according to an embodiment. As illustrated in FIG. 7, a filter 70 includes a direct-coupled resonator filter with feedback 72 and a series LC tank 14. The filter 70 is like the filter 10 of FIG. 1 except that the second LC resonant circuit 74 of the direct-coupled resonator filter with feedback 72 is different than the second LC resonant circuit 24 of FIG. 1. The second LC resonant circuit 74 is a parallel LC shunt circuit. The filter 70 can be a receive filter. For instance, the filter 70 can be in a diversity receiver. The filter 70 can be implemented instead of the filter 10, for example, in applications where a band pass filter does not have stringent harmonic rejection specifications.

Figure 8:
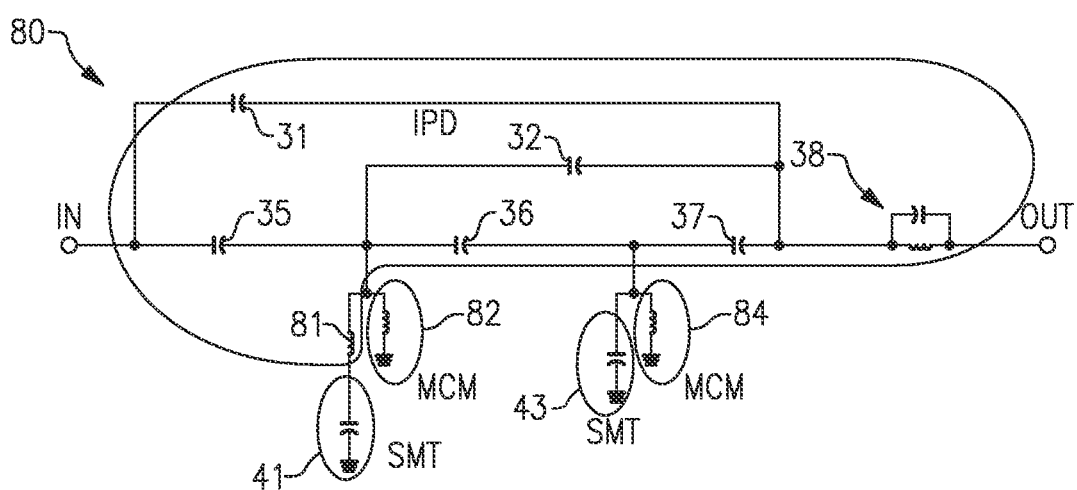
FIG. 8 is a schematic diagram of a band pass filter according to an embodiment.

FIG. 8 is a schematic diagram of a band pass filter 80 according to an embodiment. The band pass filter 80 can be implemented in a diversity receive module. For instance, the band pass filter 80 can be a Band 42/Band 43 band pass filter without harmonic rejection for a diversity receive module. The band pass filter 80 can be arranged to filter lower power signals than the band pass filter 30 of FIG. 3.

The topology of the band pass filter 80 is similar to the band pass filter 30 of FIG. 3 except that the band pass filter 80 can be designed to optimize and/or enhance performance for a band pass filter in a diversity receiver. The band pass filter 80 can have more stringent rejections at 2.4 GHz Wi-Fi and 5 GHz Wi-Fi than the band pass filter 30. The band pass filter 80 can have little or no harmonic rejection. The first and second LC resonant circuits of the band pass filter 80 are different than the corresponding LC resonant circuits of the band pass filter 30. The first LC resonant circuit of the band pass filter 80 includes an inductor 81 implemented by an IPD, while the corresponding inductor of the band pass filter 30 is implemented by conductive trace(s) of a laminate substrate. The inductor 81 on an IPD die can have a lower Q than an inductor implemented by a conductive trace. The band pass filter 80 can meet diversity receive specifications and implement the inductor 81 on the IPD die. The second LC resonant circuit of the band pass filter 80 is a parallel LC shunt circuit, while the second LC resonant circuit of the band pass filter 30 is a series LC shunt circuit in parallel with an inductor.

The band pass filter 80 has the same circuit topology as the filter 70 of FIG. 7. In the band pass filter 80, certain circuit elements are implemented by various technologies. As shown in FIG. 8, a first bridge capacitor 31, a second bridge capacitor 32, coupling capacitors 35, 36, and 37, a series LC tank 38, and an inductor 81 of a first LC resonant circuit are implemented by IPDs. These integrated passive devices can be implemented on a single IPD die. Inductor 82 of the first LC resonant circuit can be implemented by conductive trace(s) on and/or in a laminate substrate. Capacitor 41 of the first LC resonant circuit can be a surface mount capacitor. Inductor 84 of a second LC resonant circuit can be implemented by conductive trace(s) on and/or in a laminate substrate. Capacitor 43 of the second LC resonant circuit can be a surface mount capacitor.

Figure 9:
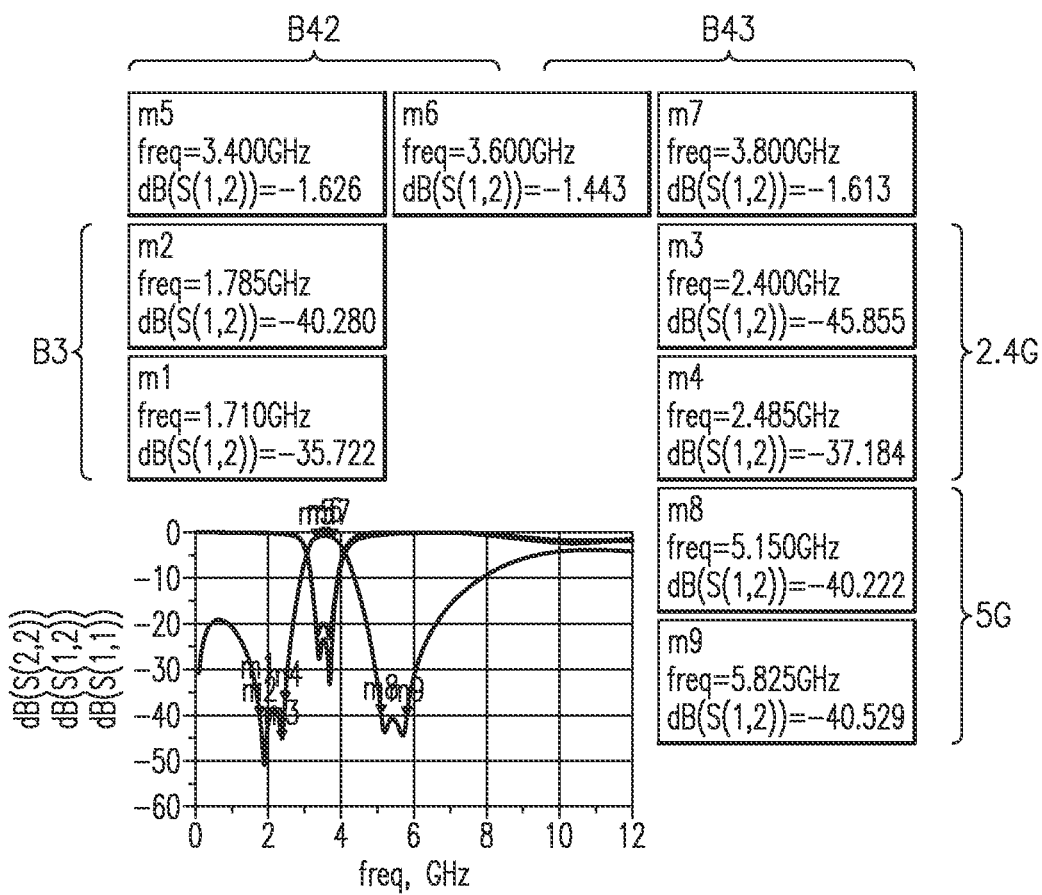
FIG. 9 is a graph of a frequency response corresponding to the band pass filter of FIG. 8 according to an embodiment.

FIG. 9 is a graph corresponding to a simulation of the band pass filter of FIG. 8 according to an embodiment. For this simulation, the IPD capacitors have a Q of 70 at 3.5 GHz, IPD inductors have a Q of 35 at 3.5 GHz, the SMT capacitors have a Q of 120 at 3.5 GHz, and the conductive traces have a Q of 50 at 3.5 GHz. These example Q values are in typical ranges of Q values for the various technologies, although other Q values can be implemented. FIG. 9 indicates that in-band insertions loss of better than 1.6 dB across Band 42 and Band 43 can be achieved by the band pass filter 80. In this graph, rejection is better than 37 dB at 2.4 GHz Wi-Fi and is better than 40 dB at 5 GHz Wi-Fi. The graph indicates that the band pass filter 80 can provides rejection of better than 35 dB for at Band 3.

The hybrid filters discussed herein can achieve desirable insertion loss, size, and cost. Acoustic wave filters, such as surface acoustic wave filters or film bulk acoustic wave resonator filters, for Band 42 are typically used only for receive paths due to limited power handling capability at Band 42 frequencies. Acoustic wave filters are compact but can have higher in-band insertion loss and be costly. As compared to acoustic wave filters, the hybrid filters discussed herein are comparable in size while lower loss and significantly cheaper. Compared to LTCC filters, the hybrid filters discussed herein have comparable loss while being cheaper and significantly smaller. Accordingly, the hybrid filters discussed herein provide a desirable combination of relatively low insertion loss, relatively small size, and relatively low cost compared to acoustic wave or LTCC filters for band pass filters for Band 42 and/or similar frequencies.

Figure 10:
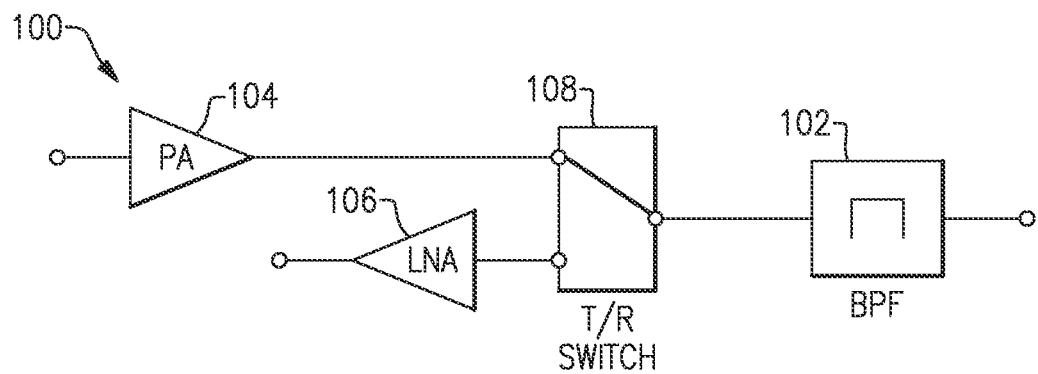
FIG. 10 is a schematic diagram of a radio frequency system that includes a band pass filter according to an embodiment.

FIG. 10 is a schematic diagram of a radio frequency system 100 that includes a band pass filter 102 according to an embodiment. As illustrated, the radio frequency system 100 includes the band pass filter 102, a power amplifier 104, a low noise amplifier 106, and a transmit/receive switch 108. The band pass filter 102 can implement any suitable principles and advantages of any of the band pass filters of FIG. 1 and/or FIG. 3 and/or FIG. 5. The power amplifier 104 can be an envelope tracking power amplifier and/or operate in an envelope tracking mode. The radio frequency system 100 can implement time division duplexing. The transmit/receive switch 108 can selectively couple the band pass filter 102 to the power amplifier 104 or the low noise amplifier 106. In some instances, the transmit/receive switch 108 and IPDs of the band pass filter 102 can be implemented on the same die. As shown in FIG. 10, the band pass filter 102 can be used for transmit filtering and for receive filtering. The band pass filter 102 can be used to pass radio frequency signals at relatively high frequencies, such as ultra high band radio frequency signals and/or frequencies above 3 GHz. As one example, the band pass filter 102 can have a passband of around 3.4 GHz to 3.6 GHz for Band 42. As another example, the band pass filter 102 can have a passband of around 3.4 GHz to 3.8 GHz for Band 42 and Band 43.

Figure 11:
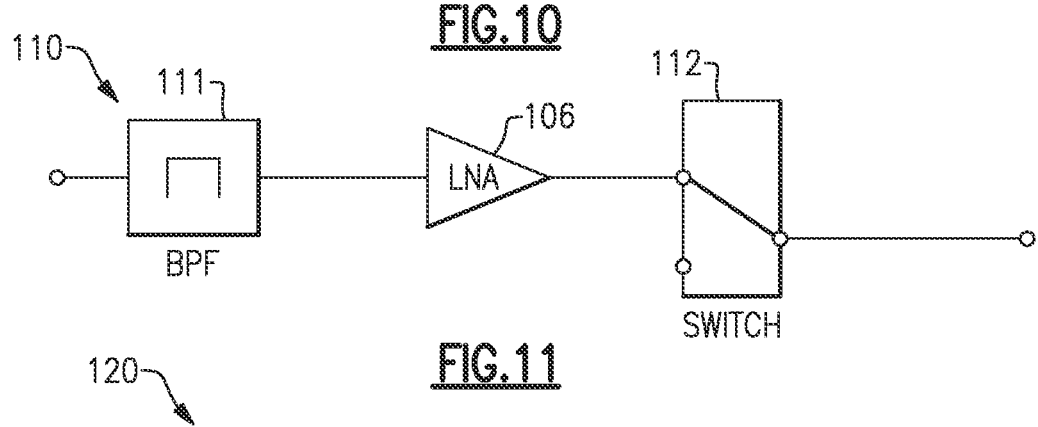
FIG. 11 is a schematic diagram of another radio frequency system that includes a band pass filter according to an embodiment.

FIG. 11 is a schematic diagram of another radio frequency system 110 that includes a band pass filter 111 according to an embodiment. As illustrated, the radio frequency system 110 includes the band pass filter 111, a low noise amplifier 106, and a radio frequency switch 112. The band pass filter 111 can implement any suitable principles and advantages of any of the band pass filters of FIG. 7 and/or FIG. 8. The radio frequency system 110 can be included in a diversity receive module. The band pass filter 111 can filter a received radio frequency signal and provide a filtered radio frequency signal to the low noise amplifier 106. The radio frequency switch 112 can selectively couple an output of the low noise amplifier 106 to a selected receive path. In some instances, the radio frequency switch 112 and IPDs of the band pass filter 111 can be implemented on the same die. The band pass filter 111 can be used to pass radio frequency signals at relatively high frequencies, such as ultra high band radio frequency signals and/or frequencies above 3 GHz. As one example, the band pass filter 111 can have a passband of around 3.4 GHz to 3.6 GHz for Band 42. As another example, the band pass filter 111 can have a passband of around 3.4 GHz to 3.8 GHz for Band 42 and Band 43.

Figure 12:
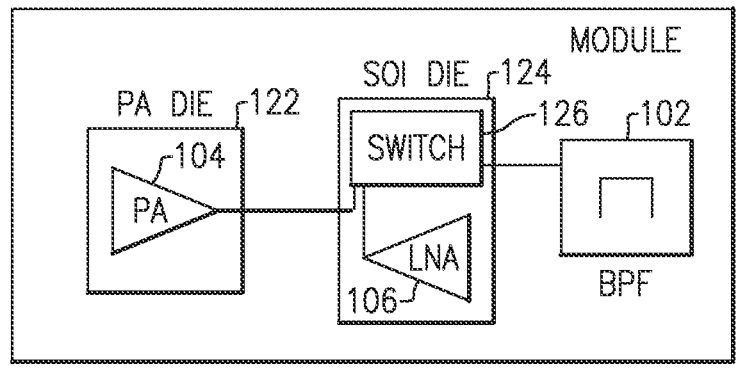
FIG. 12 is a schematic diagram of a radio frequency module that includes a band pass filter according to an embodiment.

FIG. 12 is a schematic diagram of a radio frequency module 120 that includes a band pass filter 102 according to an embodiment. The radio frequency module 120 can include the radio frequency system 100 of FIG. 10. As illustrated, the radio frequency module 120 includes a band pass filter 102, a power amplifier die 122 that includes a power amplifier, and a silicon-on-insulator die 124 that includes the low noise amplifier 106 and a switch 126. The switch 126 can be a transmit/receive switch, such as the transmit/receive switch 108 of FIG. 10. The radio frequency module 120 can be a front end module.

Figure 13:
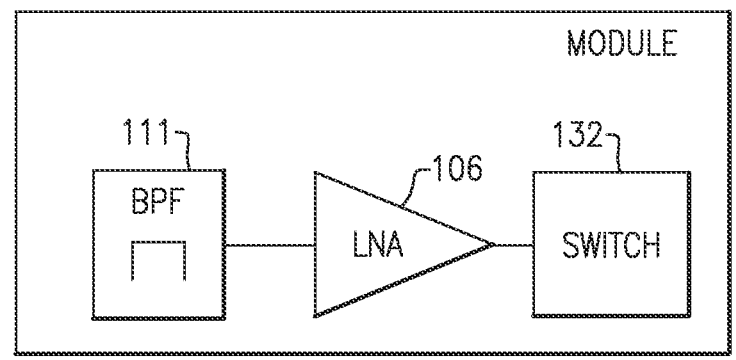
FIG. 13 is a schematic diagram of another radio frequency module that includes a band pass filter according to an embodiment.

FIG. 13 is a schematic diagram of another radio frequency module 130 that includes a band pass filter 111 according to an embodiment. The radio frequency module 130 can include the radio frequency system 110 of FIG. 11. As illustrated, the radio frequency module 130 includes a band pass filter 111, a low noise amplifier 106, and a switch 132. The low noise amplifier 106 and the switch 132 can be implemented on a silicon-on-insulator die. In certain instances, the switch 132 can be a receive switch. In some instances, the switch 132 can be a transmit/receive switch. The radio frequency module 130 can be a diversity receive module. In such instances, the radio frequency module 130 can include a diversity receive port configured to receive a radio signal from a diversity antenna. The band pass filter 111 can receive the radio frequency signal from the diversity receive port.

Figure 14:
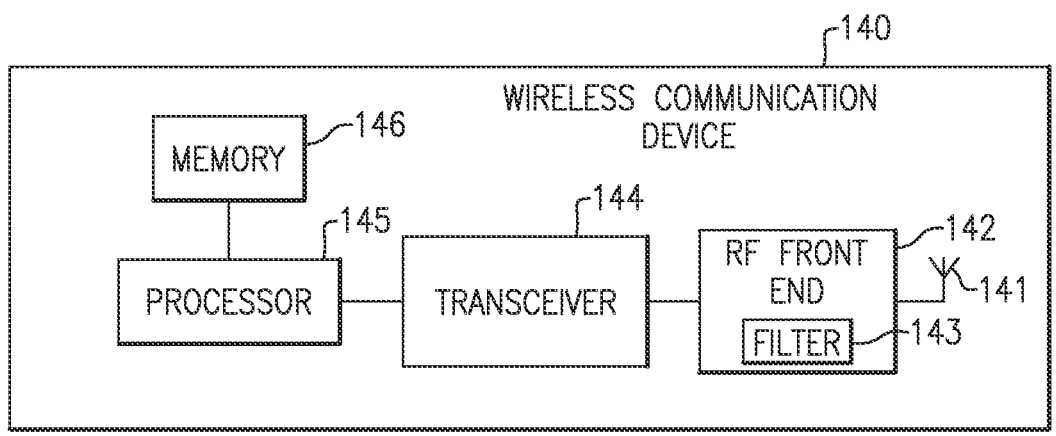
FIG. 14 is a schematic diagram of a wireless communication device that includes a band pass filter in a radio frequency front end according to an embodiment.

FIG. 14 is a schematic diagram of a wireless communication 140 device that includes a band pass filter 143 in a radio frequency front end 142 according to an embodiment. The wireless communication device 140 can be any suitable wireless communication device. For instance, a wireless communication device 140 can be a mobile phone, such as a smart phone. As illustrated, the wireless communication device 140 includes an antenna 141, an RF front end 142 that includes a band pass filter 143, a transceiver 144, a processor 145, and a memory 146. The antenna 141 can transmit RF signals provided by the RF front end 142. Such RF signals can include carrier aggregation signals. The antenna 141 can provide received RF signals to the RF front end 142 for processing. Such RF signals can include carrier aggregation signals.

The RF front end 142 can include one or more power amplifiers, one or more low noise amplifiers, RF switches, receive filters, transmit filters, duplex filters, multiplexers, frequency multiplexing circuits, or any combination thereof. The RF front end 142 can transmit and receive RF signals associated with any suitable communication standards. The filter 143 can be implemented in accordance with any suitable principles and advantages of the filters discussed herein. For instance, the filter 143 can implement any suitable combination of features disclosed with reference to any of FIGS. 1 to 6B.

The transceiver 144 can provide RF signals to the RF front end 142 for amplification and/or other processing. The transceiver 144 can also process an RF signal provided by a low noise amplifier of the RF front end 142. The transceiver 144 is in communication with the processor 145. The processor 145 can be a baseband processor. The processor 145 can provide any suitable base band processing functions for the wireless communication device 140. The memory 146 can be accessed by the processor 145. The memory 146 can store any suitable data for the wireless communication device 140.

Figure 15:
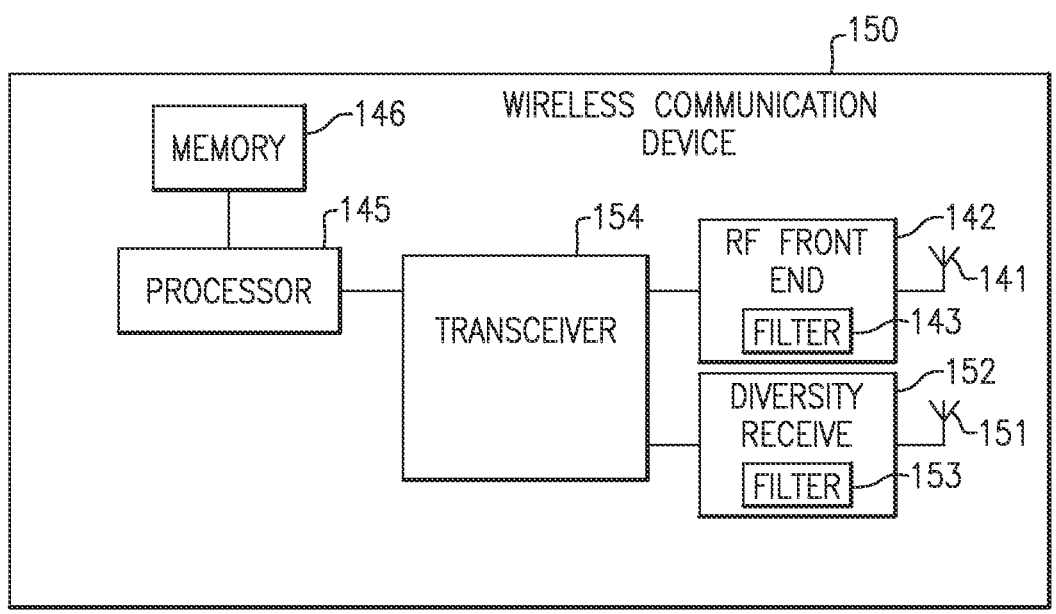
FIG. 15 is a schematic diagram of a wireless communication device that includes a first band pass filter in a radio frequency front end and a second band pass filter in a diversity receive module according to an embodiment.

FIG. 15 is a schematic diagram of a wireless communication device 150 that includes a first band pass filter 143 in a radio frequency front end 142 and a second band pass filter 153 in a diversity receive module 152 according to an embodiment. The wireless communication device 150 is like the wireless communication device 140 of FIG. 14, except that the wireless communication device 150 also includes diversity receive features. As illustrated in FIG. 15, the wireless communication device 150 includes a diversity antenna 151, a diversity module 152 configured to process signals received by the diversity antenna 151 and including a filter 153, and a transceiver 154 in communication with both the radio frequency front end 142 and the diversity receive module 152. The filter 153 can be implemented in accordance with any suitable principles and advantages of the filters discussed herein. For instance, the filter 153 can implement any suitable combination of features disclosed with reference to any of FIGS. 7 to 9.

Any of the principles and advantages discussed herein can be applied to other suitable systems, modules, chips, filters, wireless communication devices, and methods not just to the systems, modules, chips, filters, wireless communication devices, and methods described above. The elements and operations of the various embodiments described above can be combined to provide further embodiments. Any of the principles and advantages discussed herein can be implemented in association with radio frequency circuits configured to process signals in a range from about 30 kHz to 300 GHz, such as in a range from about 450 MHz to 8.5 GHz.

Aspects of this disclosure can be implemented in various electronic devices. Examples of the electronic devices can include, but are not limited to, consumer electronic products, parts of the consumer electronic products such as chips and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a vehicular electronics system such as an automotive electronics system, a microwave, a refrigerator, a stereo system, a digital music player, a camera such as a digital camera, a portable memory chip, a household appliance, etc. Further, the electronic devices can include unfinished products.

Conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application.

While certain embodiments have been described, these embodiments have been presented by way of example only, and are not intended to limit the scope of the disclosure. Indeed, the novel devices, chips, methods, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A wireless communication device comprising:
an antenna;
a low noise amplifier; and
a band pass filter in a signal path between the antenna and the low noise amplifier, the band pass filter including a first resonant circuit, a second resonant circuit and an integrated passive device capacitor coupled between the first resonant circuit and the second resonant circuit, the first resonant circuit including an inductor and a capacitor, the integrated passive device capacitor being included on an integrated passive device die, the capacitor being external to the integrated passive device die, and the capacitor having a higher quality factor than the integrated passive device capacitor.

2. The wireless communication device of claim 1 further comprising a switch and a power amplifier, the switch configured to selectively electrically connect the low noise amplifier to the band pass filter, and the switch configured to selectively electrically connect the power amplifier to the band pass filter.

3. The wireless communication device of claim 1 wherein the second resonant circuit includes a second capacitor and a second inductor, the second capacitor is external to the integrated passive device die, and the second capacitor has a higher quality factor than the integrated passive device capacitor.

4. The wireless communication device of claim 1 wherein a lower bound of a passband of the band pass filter is above 3 gigahertz.

5. The wireless communication device of claim 1 wherein the capacitor is a surface mount capacitor, the inductor includes a conductive trace of a substrate, and the integrated passive device die is on the substrate.

6. The wireless communication device of claim 1 wherein the band pass filter includes a second integrated passive device capacitor on the integrated passive device die, and the second integrated passive device capacitor is in series with the integrated passive device capacitor.

7. The wireless communication device of claim 6 wherein the band pass filter includes a bridge capacitor in parallel with a series combination of the integrated passive device capacitor and the second integrated passive device capacitor, the bridge capacitor being on the integrated passive device die.

8. A band pass filter comprising:
a first resonant circuit including an inductor and a capacitor;
a second resonant circuit; and
an integrated passive device capacitor coupled between the first resonant circuit and the second resonant circuit, the integrated passive device capacitor being included on an integrated passive device die, the capacitor being external to the integrated passive device die, and the capacitor having a higher quality factor than the integrated passive device capacitor; the band pass filter having a pass band.

9. The band pass filter of claim 8 wherein the second resonant circuit includes a second capacitor and a second inductor, the second capacitor is external to the integrated passive device die, and the second capacitor has a higher quality factor than the integrated passive device capacitor.

10. The band pass filter of claim 8 wherein a lower bound of a passband of the band pass filter is above 3 gigahertz.

11. The band pass filter of claim 10 wherein an upper bound of the passband of the band pass filter is not more than 3.8 gigahertz.

12. The band pass filter of claim 8 wherein the capacitor is a surface mount capacitor and the inductor includes a trace of a substrate.

13. The band pass filter of claim 8 further comprising additional integrated passive device capacitors on the integrated passive device die, the additional integrated passive device capacitors being in series with the integrated passive device capacitor.

14. The band pass filter of claim 13 wherein the band pass filter includes an LC tank in series with the integrated passive device capacitor and the additional integrated passive device capacitors, and the LC tank is on integrated passive device die.

15. The band pass filter of claim 13 further comprising a bridge capacitor in parallel with a series combination of the integrated passive device capacitor and the additional integrated passive device capacitors.

16. The band pass filter of claim 15 further comprising a second bridge capacitor in parallel with a subset of capacitors of the series combination of the integrated passive device capacitor and the additional integrated passive device capacitors.

17. A method of manufacturing a band pass filter, the method comprising:
providing a substrate with conductive traces;
mounting surface mount technology capacitors on the substrate such the conductive traces and the surface mount technology capacitors form at least a first resonant circuit and a second resonant circuit; and
attaching an integrated passive device die to the substrate such that, after the mounting and the attaching, the surface mount technology capacitors are external to the integrated passive device die and the band pass filter includes the first resonant circuit, the second resonant circuit, and a capacitor of the integrated passive device die coupled between the first resonant circuit and the second resonant circuit.

18. The method of claim 17 wherein the band pass filter includes additional integrated passive device capacitors of the integrated passive device die.

19. The method of claim 17 wherein the attaching includes flip chip mounting the integrated passive device die on the substrate.

20. The method of claim 17 wherein the mounting electrically connects a first end of a first surface mount technology capacitor of the surface mount technology capacitors to ground and electrically connects a second end of the first surface mount technology capacitor to a first conductive trace of the conductive traces.

* * * * *